(12) United States Patent
Chien et al.

(10) Patent No.: US 6,509,235 B2
(45) Date of Patent: Jan. 21, 2003

(54) METHOD FOR MAKING AN EMBEDDED MEMORY MOS

(75) Inventors: Sun-Chieh Chien, Hsin-Chu (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 22 days.

(21) Appl. No.: 09/764,333

(22) Filed: Jan. 19, 2001

(65) Prior Publication Data

US 2002/0098634 A1 Jul. 25, 2002

(51) Int. Cl.$^7$ ............................................. H01L 21/8232
(52) U.S. Cl. ...................... 438/275; 438/231; 438/241; 438/532
(58) Field of Search ................................ 438/275, 305, 438/231, 532, 258, 241, FOR 188

(56) References Cited

U.S. PATENT DOCUMENTS

| | | | |
|---|---|---|---|
| 5,329,482 A | * | 7/1994 | Nakajima et al. |
| 5,863,820 A | * | 1/1999 | Huang et al. |
| 5,972,764 A | * | 10/1999 | Huang et al. |
| 6,037,222 A | * | 3/2000 | Huang et al. |

* cited by examiner

Primary Examiner—Wael Fahmy
Assistant Examiner—Joannie Adelle Garua
(74) Attorney, Agent, or Firm—Winston Hsu (57) ABSTRACT

The present invention provides a method for forming an embedded memory MOS. The method involves first forming a dielectric layer and an undoped polysilicon layer, respectively, on the surface of the semiconductor wafer with a defined memory array area and a periphery circuits region. Then, the undoped polysilicon layer in the memory array area is doped to become a doped polysilicon layer. Thereafter, a protective layer is formed on the surface of the semiconductor wafer, followed by a first photolithographic and etching process (PEP) to define a plurality of gate patterns in the protective layer in the memory array area. Then, a second PEP is applied to etch the undoped polysilicon layer in the periphery circuits region and the doped polysilicon layer in the memory array area to simultaneously form a gate of each MOS in the periphery circuits region and the memory array area. Finally, a lightly doped drain (LDD) of each MOS is formed, as well as a spacer and a source/drain (S/D) adjacent to each gate in the periphery circuits region.

17 Claims, 7 Drawing Sheets

METHOD FOR MAKING AN EMBEDDED MEMORY MOS

BACKGROUND OF THE INVENTION

1. Field of the Invention

The present invention provides a method for forming an embedded memory MOS.

2. Description of the Prior Art

Due to continued process of integration, it is the present trend to produce semiconductor integrated circuits that simultaneously integrate a memory cell array and high-speed logic circuit elements onto a single chip. The result is the formation of an embedded memory which simultaneously combines a memory cell array and logic circuits, so as to save space and to enhance the speed of signal processing.

Please refer to FIG. 1 to FIG. 7. FIG. 1 to FIG. 7 are the cross-sectional schematic diagrams of making an embedded memory MOS on a semiconductor wafer 10 according to the prior art. The semiconductor wafer 10 comprises a silicon substrate 16, with a memory array area 12 and a periphery circuits region 14 defined on the surface of the silicon substrate 16. The memory array area 12 further comprises a single cell-well 13, and the periphery circuits region 14 further comprises a N-well 15 and a P-well 17. Each well is isolated by a plurality of shallow trench isolations 11.

Figure 1:
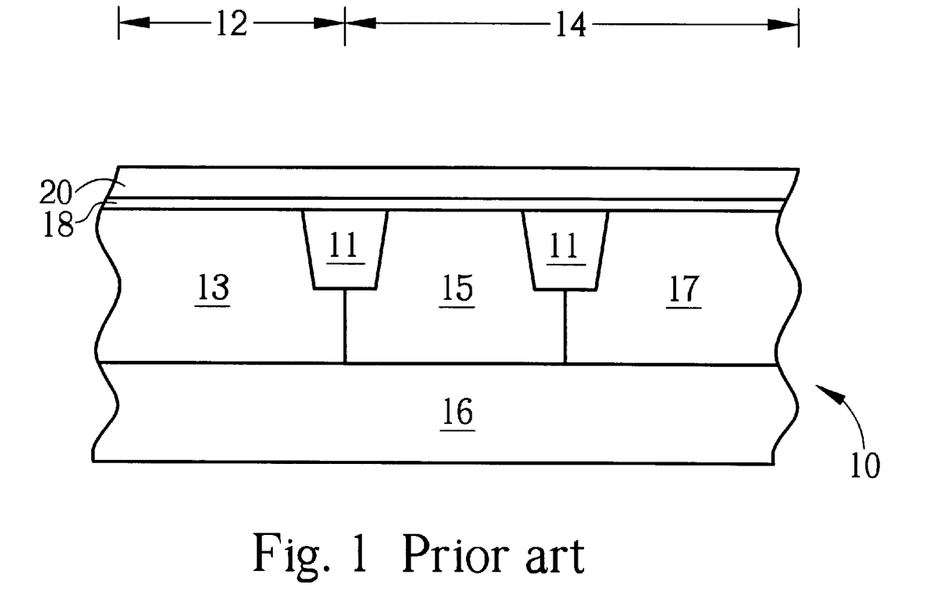
FIG. 1 to FIG. 7 are the cross-sectional schematic diagrams of manufacturing an embedded memory MOS by a prior art method.
Figure 2:
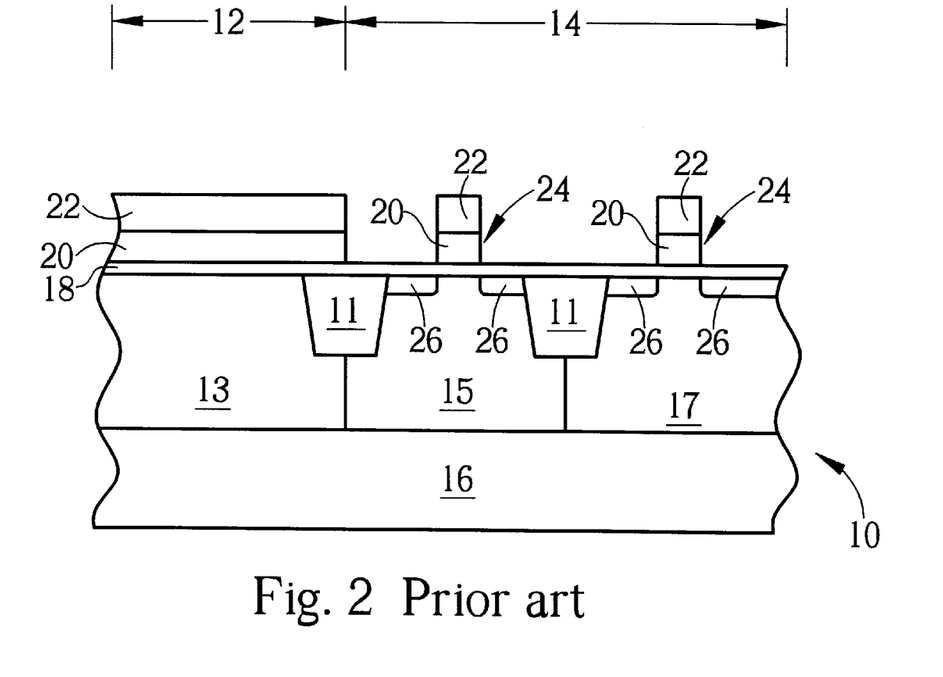

As shown in FIG. 1, the method for forming an embedded memory MOS according to the prior art involves first depositing a silicon dioxide layer 18 and an undoped polysilicon layer 20, respectively, on the surface of a semiconductor wafer 10. Then, as shown in FIG. 2, a photoresist layer 22 is formed on the surface of the semiconductor wafer 10, followed by a photo process to define gate patterns of various PMOS and NMOS on the photoresist layer 22 in the periphery circuits region 14. Each gate pattern is subsequently used as a hard mask to etch the undoped polysilicon layer 20 down to the surface of the silicon dioxide layer 18, to form the gates 24 of both the PMOS and NMOS. Then, an ion implantation process is used to form lightly doped drains (LDD) 26 of each MOS.

Figure 3:
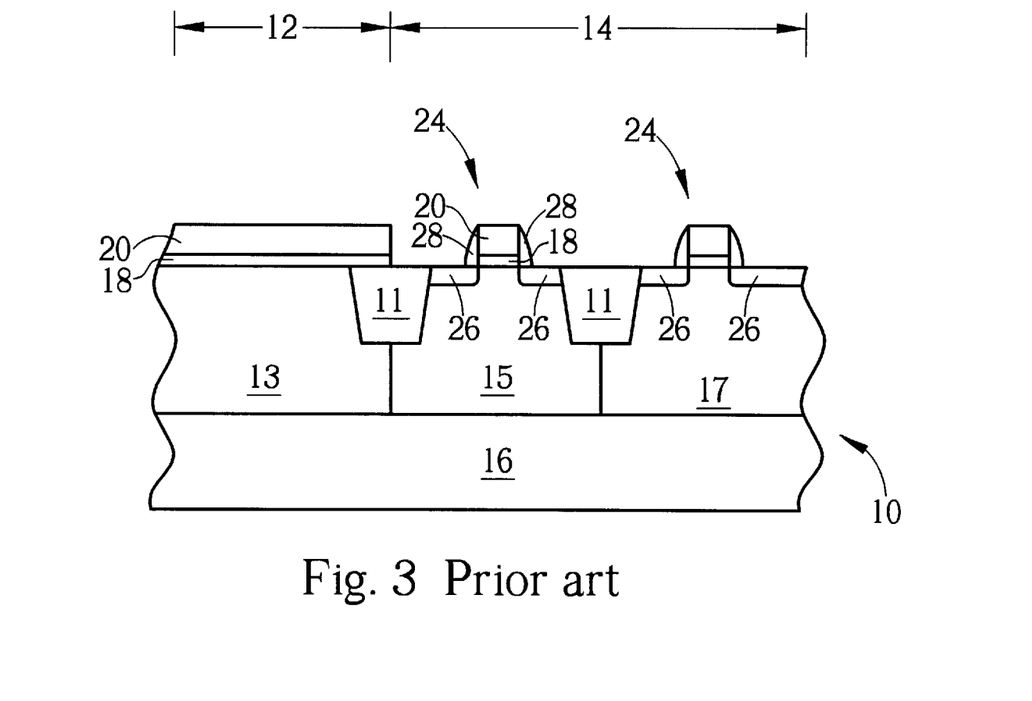
Figure 4:
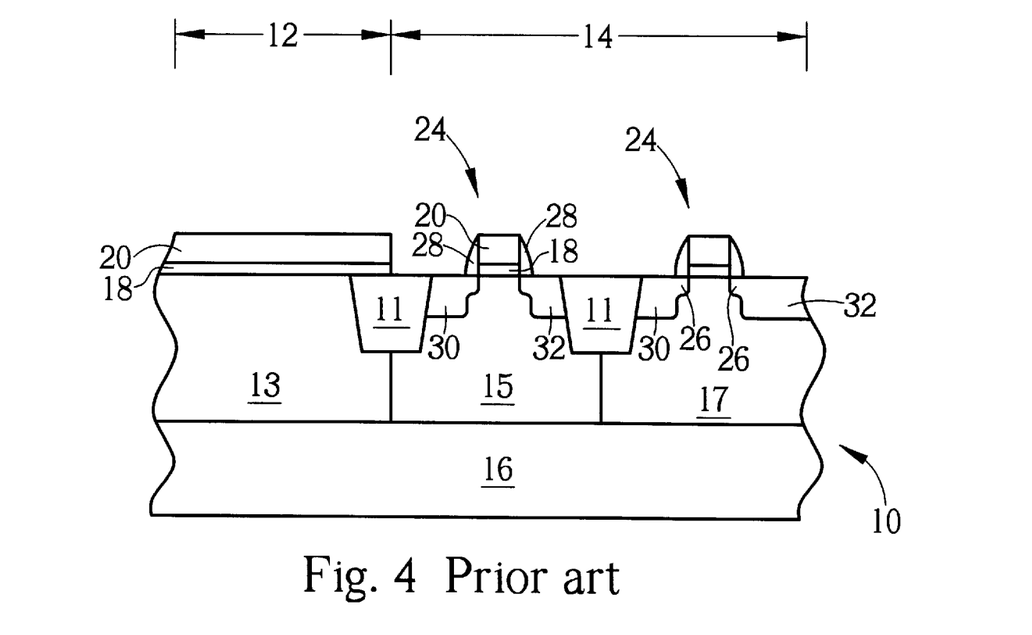

After the complete removal of the photoresist layer 22 and the gate oxide layer 18 not covered by the gates 24, as shown in FIG. 3, a silicon nitride layer (not indicated) is formed on the surface of the semiconductor wafer 10, followed by an anisotropic etching process to form a spacer 28 located on either side of the gates 24 in the periphery circuits region 14. As shown in FIG. 4, two photo processes are used prior to ion implantation processes for two different ion implantation areas to form both a source 30 and a drain 32 for each PMOS and NMOS on top of each N well 17 and P well 15 in the periphery circuits region 14. At the same time, application of the ion implantation processes for the two different ion implantation areas lead to doping of the undoped polysilicon layer 20 of each gate 24 located on top of the P well 15 and N well 17.

Figure 5:
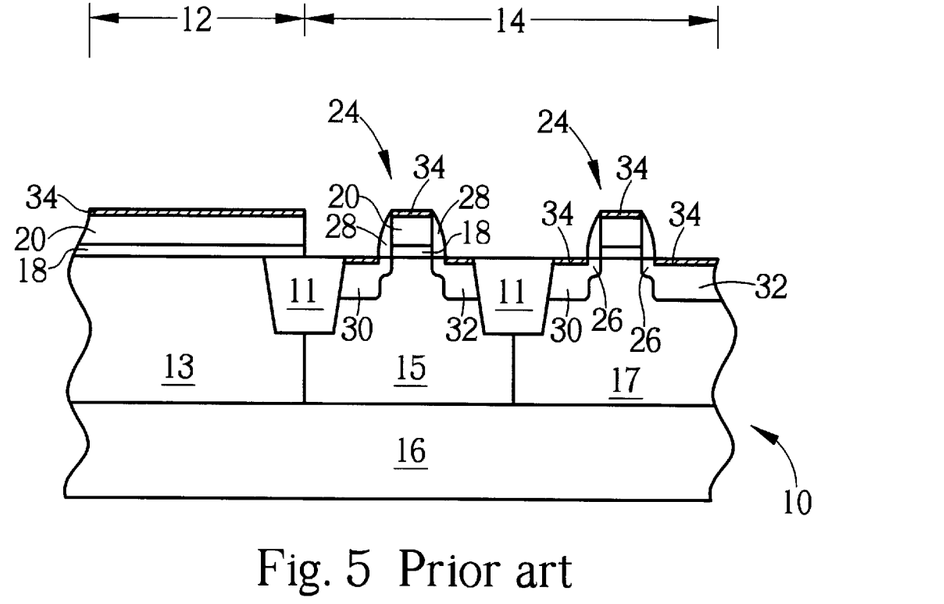

As shown in FIG. 5, after completing the formation of the source 30 and drain 32 of each MOS in the periphery circuits region 14, a metal layer (not indicated) composed of Titanium(Ti) or Copper(Co) is sputtered on the surface of semiconductor wafer 10, followed by a first rapid thermal process (RTP) with a temperature range of 500° C.~700° C. and a heating duration of 10~30 seconds. Consequently, the Titanium atoms or Copper atoms in the metal layer diffuse into the surface of the undoped polysilicon layer 20 in the memory array area 12 and the surfaces of the source 30, drain 32 and gate 24 in the periphery circuits regions 14. Then, a wet etching process is performed to remove the unreacted metal layer on the surface of the semiconductor wafer 10. A second rapid thermal process (RTP) is used with a temperature range of 700° C.~900° C. and a heating duration of 10~30 seconds to form a self aligned metal silicide layer 34 on the surface of the undoped polysilicon layer 20 in the memory array area 12, as well as on the surfaces of the source 30, drain 32 and gate 24 in the periphery circuits area.

Figure 6:
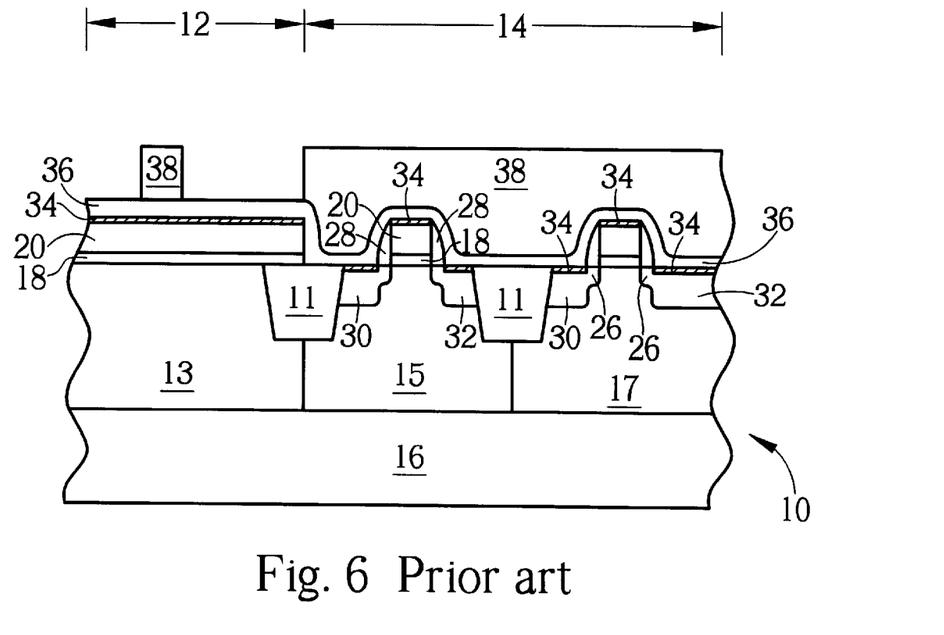

Thereafter, an insulator layer 36 composed of silicon nitride or silicon oxynitride ($SiO_xN_y$), is deposited on the semiconductor wafer 10, followed by a photo process to form a photoresist layer 38 on top of the insulator layer 36. As shown in FIG. 6, a photolithographic, exposure and development process is then performed to define a plurality of gate patterns in the photoresist layer 38 in the memory array area 12.

Figure 7:
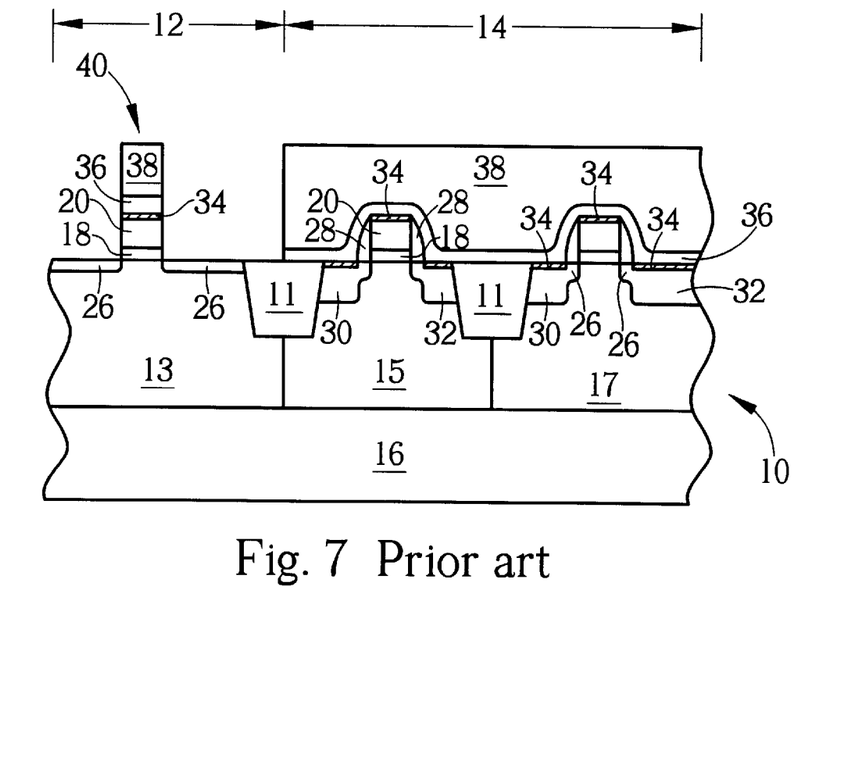

Finally as shown in FIG. 7, the gate patterns in the photoresist layer 38 is used as a hard mask to etch the insulator layer 36, the self aligned silicide layer 34, the undoped polysilicon layer 20, and the silicon dioxide layer 18 down to the surface of the silicon substrate 16 in order to form the gate 40 of each MOS in the memory array area 12.

The gate 40 in the memory array area 12 is required to have a cap layer 38 in order to make the successive self-aligned contact (SAC) process proceed smoothly. However, a cap layer cannot be formed on the surface of the gate 24 in the periphery circuits region 14. Thus, the surface sheet resistance (Rs) of each source 30, drain 32, and gate 34 in the successive self aligned silicide (salicide) process cannot be lowered. Therefore, in the prior art method for making the embedded memory MOS, repeated photolithographic and etching processes are needed in order to integrate the formation of gates in the memory array area and the periphery circuits region. The result is an increase in both the complexity of process and the production cost, as well as a reduction in throughput.

SUMMARY OF THE INVENTION

It is therefore a primary objective of the present invention to provide a method of forming an embedded memory MOS, so as to simultaneously form gates in the memory array area and the periphery circuits region so as to simplify the manufacturing process.

The method according to the present invention involves first forming a dielectric layer and an undoped polysilicon layer, respectively, on the surface of a semiconductor wafer with a defined memory array area and a periphery circuits region. Then, doping of the undoped polysilicon layer in the memory array area occurs to form a doped polysilicon layer. Thereafter, a protective layer is formed on the surface of the semiconductor wafer, followed by a first photolithographic and etching process (PEP) to define a plurality of gate patterns in the protective layer in the memory array area. Then, a second PEP is peformed to etch the undoped polysilicon layer in the periphery circuits region and the doped polysilicon layer in the memory array area to simultaneously form a gate of the MOS in both the periphery circuits region and the memory array area. Finally, a lightly doped drain (LDD) and a source/drain (S/D) of each MOS are formed adjacent to each gate, as well as a spacer formed on either side of each gate.

It is an advantage of the present invention that in the method for making the embedded memory MOS, the gate structures in both the memory array area and periphery circuits region can be simultaneously formed to decrease both process complexity and production cost.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 8:
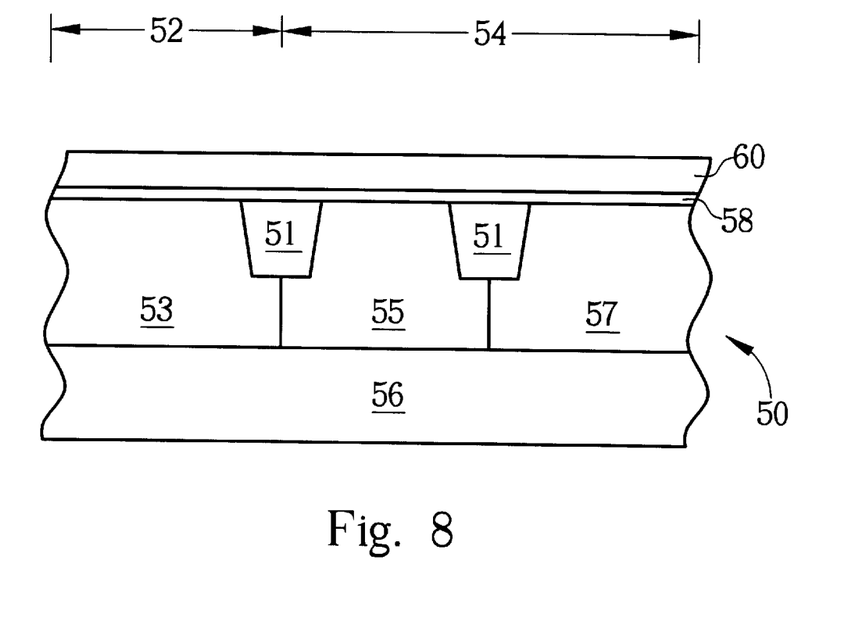
FIGS. 8 to 14 are the cross-sectional schematic diagrams of manufacturing an embedded memory MOS by the present invention method.

Please refer to FIG. 8 to FIG. 14. FIG. 8 to FIG. 14 are the schematic diagrams of the method for making an embedded memory MOS on a semiconductor wafer 50 according to the present invention. The semiconductor wafer 50 comprises a silicon substrate 56, a memory array area 52 and a periphery circuits region 54 on the surface of the silicon substrate 56. The memory array area 52 further comprises at least one single cell-well 53, and the periphery circuits region 54 further comprises at least one N well 55 and at least one P well 57. Each well is isolated by a plurality of shallow trench isolation structures 51. As shown in FIG. 8, the method according to the present invention first forms a dielectric layer 58 and an undoped polysilicon layer 60, respectively, on the surface of the semiconductor wafer 50. The dielectric layer 58 is composed of silicon dioxide ($SiO_2$) and is used as the gate oxide layer of each MOS.

Figure 9:
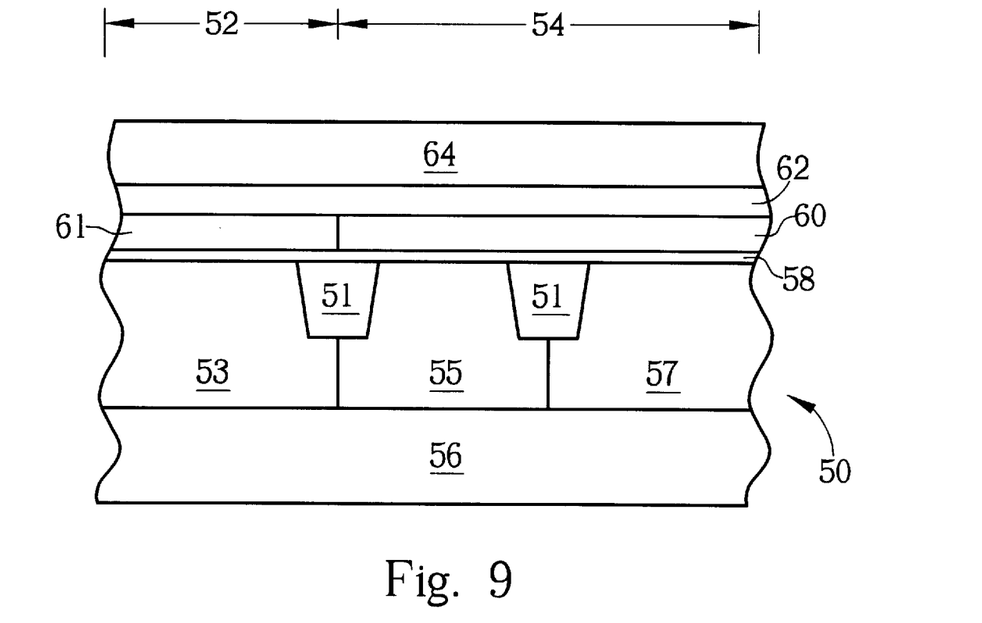

As shown in FIG. 9, a photolithographic process followed by an ion implantation process is performed on the undoped polysilicon layer 60 in the memory array area 52 to transform the undoped polysilicon layer 60 in the memory array area to a doped polysilicon layer 61. Thereafter, a protective layer 62 and a photoresist layer 64 are formed, respectively, on the surface of the semiconductor wafer 50. The protective layer 62 is composed of a silicon nitride compound, and another first silicon-oxy-nitride ($SiO_xN_y$) layer(not indicated) is positioned between the protective layer 62 and the undoped polysilicon layer 60 to function as an anti-reflection coating (ARC).

Figure 10:
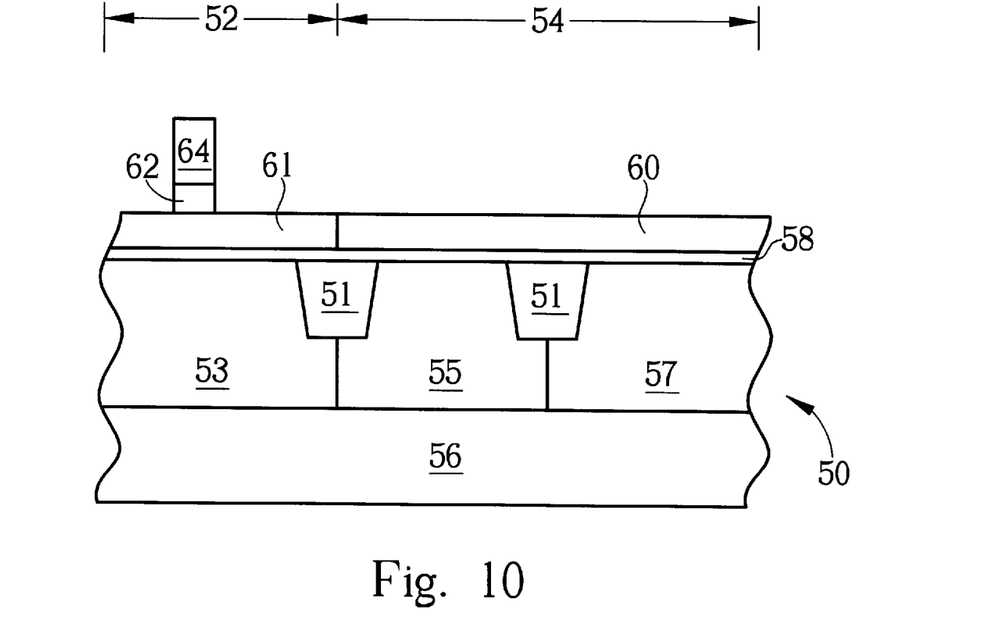

As shown in FIG. 10, then a photolithographic, exposure and development process is proceeded in order to define a plurality of gate patterns 63 in the photoresist layer 64 above the single cell-well 53 in the memory array area 52. Next, the patterns in the photoresist layer 64 are used as a hard mask for etching the protective layer 62 in the memory array area 52 down to the surface of the doped polysilicon layer 61.

Figure 11:
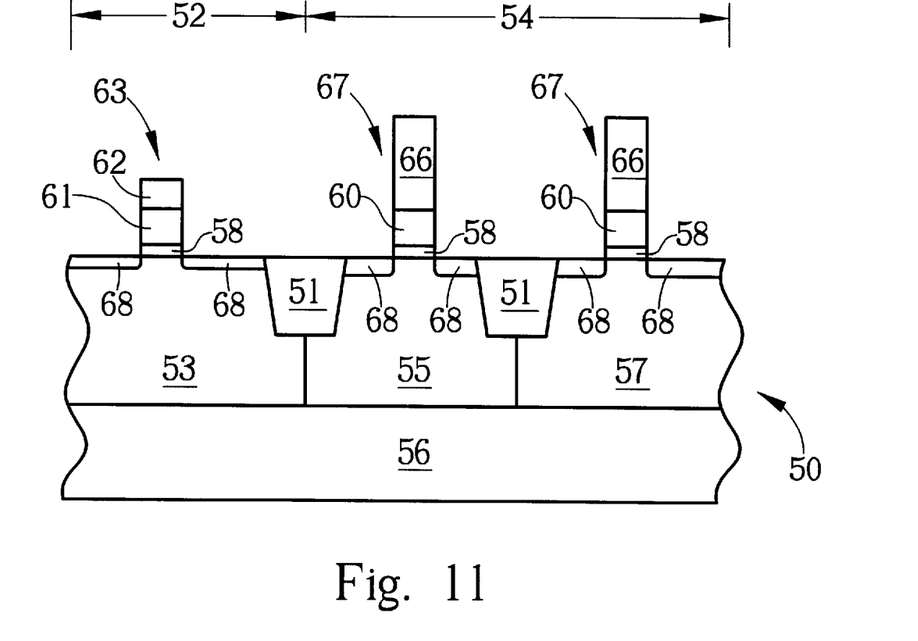

After completely stripping the photoresist layer 64, a photoresist layer 66 is formed on the surface of the semiconductor wafer 50, wherein prior to the formation of the photoresist layer 66, a silicon-oxy-nitride ($SiO_xN_y$) layer (not indicated) is positioned on the surface of the semiconductor wafer 50 as an anti-reflection coating. Then, a photolithographic process is performed to define a plurality of gate patterns 67 in the photoresist layer 66 in the N well 55 and the P well 57 in the periphery circuits region 54. As shown in FIG. 11, the patterns in the photoresist layer 66 and the protective layer 62 remaining on the surface of the doped polysilicon layer 61 are used as a hard mask to etch the undoped polysilicon layer 60 in the periphery circuits region 54 and the doped polysilicon layer 61 in the memory array area 52 down through the surface of the dielectric layer 58. As a result, gates 63, 67 of each MOS in the memory array area 52 and the periphery circuits region 54 are simultaneously formed. Thereafter, an ion implantation process is used to form lightly doped drains (LDD) 68 of each MOS on the semiconductor wafer 50.

Figure 12:
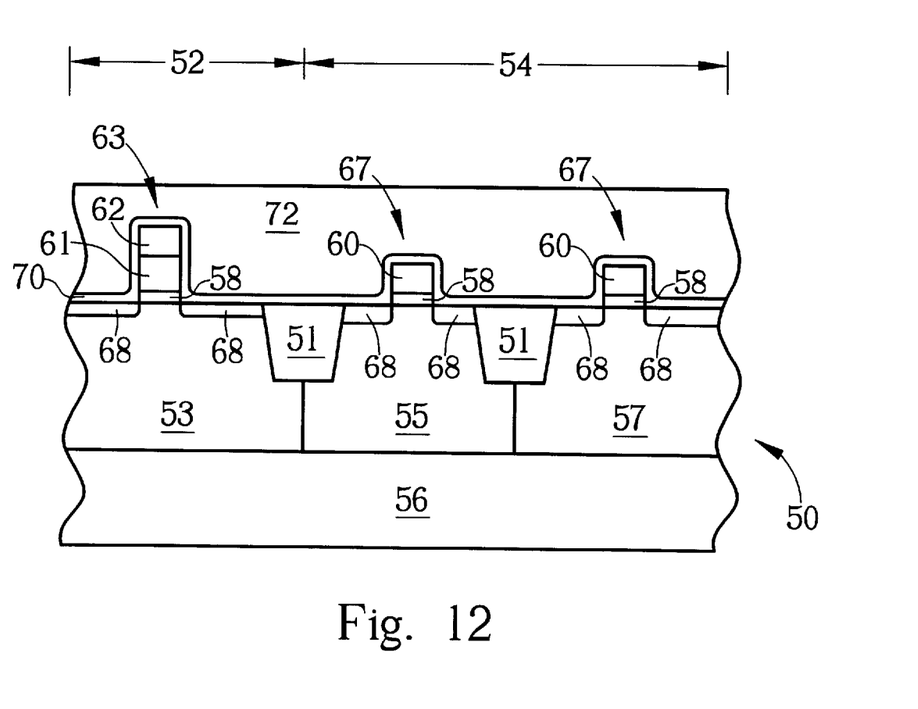

As shown in FIG. 12, the photoresist layer 66 and the silicon-oxy-nitride ($SiO_xN_y$) layer(not indicated), formed beneath the photoresist layer 66, are then stripped, respectively. Then, a silicon nitride layer 70 and a dielectric layer 72 are formed, respectively, on the surface of the semiconductor wafer 50 to cover the surfaces of each gate 63, 67.

Figure 13:
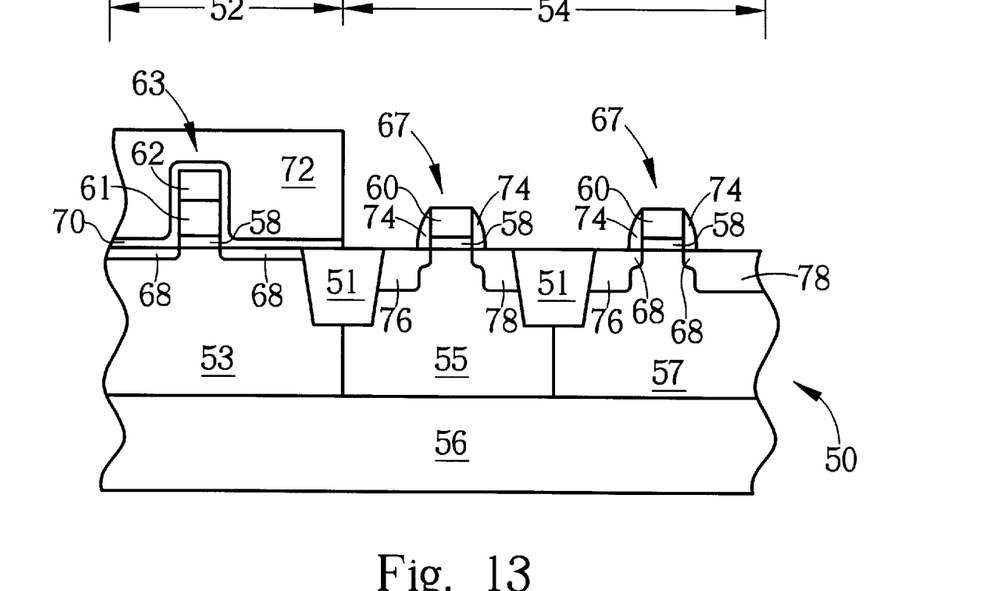

As shown in FIG. 13, two photolithographic and etching processes (PEP) are performed to make the successive process of the PMOS and the NMOS, respectively. More specifically, a first PEP is used to etch the dielectric layer 72 and the silicon nitride layer 70 around the gate 67 above the P well 55 in the periphery circuits region 54 to form a spacer 74 on either side of the gate 67. Then, an ion implantation process is used to form a source 76 and drain 78 of the NMOS in the P well 55. Thereafter, a second PEP is used to etch the dielectric layer 72 and the silicon nitride layer 70 around the gate 67 above the N well 57 in the periphery circuits region 54 to form the spacer 74 on either side of the gate 67. Then, an ion implantation process is used to form the source 76 and drain 78 of the PMOS in the N well 57. As well, during the ion implantation process for forming the source 76 and drain 78 of the NMOS and PMOS, doping of the undoped polysilicon layer 60 in each gate 67 above the P well 55 and the N well 57 also occurs.

Figure 14:
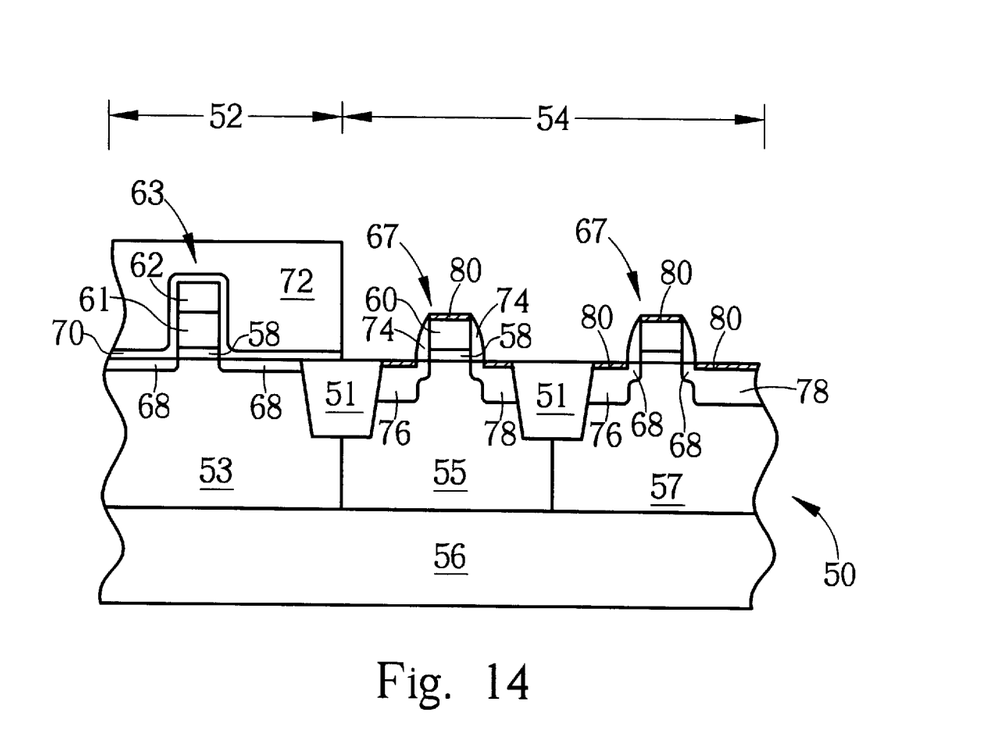

As shown in FIG. 14, after complete formation of the source 76 and drain 78 of each MOS in the periphery circuits region 54, a metal layer(not indicated) composed of Copper (Co) is deposited on the surface of the semiconductor wafer 50, and covering the surfaces of each source 76, drain 78 and gate 67 in the periphery circuits region 54. Then, a first rapid thermal process (RTP) with a temperature range of 400°~600° C. and a heating duration of 10~50 seconds is performed to allow the Copper atoms in the metal layer to diffuse into the surface of each source 76, drain 78 and gate 67. Then, a wet etching process is used to remove the unreacted metal layer on the surface of the semiconductor wafer 50. Finally, a second rapid thermal process (RTP) with a temperature range of 600°~800° C. and a heating duration of 10~50 seconds, is performed to form a self aligned silicide layer 80 on the surfaces of each gate 67, source 76 and drain 78 in the periphery circuits region 54. Herein, the metal layer can be comprised of Titanium (Ti), Nickel (Ni) or Molybdenum (Mo).

In summary, the method according to the present invention for making an embedded memory MOS is to form a dielectric layer 58 and an undoped polysilicon layer 60 which are used as the gate oxide layer and the conductive layer of each of the gate in the memory array area 52 and the periphery circuits region 54, respectively. Then, a plurality of gate patterns 63 are defined in the protective layer 62 above the memory array area 52, followed by a plurality of gate 67 patterns defined in the photoresist layer 66 above the periphery circuits region 54. The patterns in the photoresist layer 66 and the remaining protective layer 62 are then used as a hard mask to form the gates 63,67 of each MOS in the memory array area 52 and the periphery circuits region 54.

In contrast to the prior method of forming the embedded memory MOS, the present invention simultaneously forms the gate in the periphery circuits region and the memory array area. In contrast to the prior art method of forming the source and drain of an NMOS and PMOS using two photolithographic processes followed by the ion implantation processes in two different ion implantation areas, the present invention applies a dielectric layer to separate the two ion implantation processes in different ion implantation areas and simultaneously, the spacer can be formed on either side of the gate of the MOS. Thus, a decrease in both the process complexity and the production cost are achieved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making an embedded memory metal oxide semiconductor (MOS), the method comprising:

providing a semiconductor wafer, with a memory array area and a periphery circuits region defined on the surface of the silicon substrate of the semiconductor wafer;

forming a first dielectric layer and an undoped polysilicon layer, respectively, on the surface of the semiconductor wafer;

performing a first ion implantation process in the undoped polysilicon layer in the memory array area so as to transform the undoped polysilicon layer in the memory array area to a doped polysilicon layer;

forming a protective layer and a first photoresist layer on the surface of the semiconductor wafer, respectively;

performing a first photolithographic process so as to define a plurality of gate patterns in the first photoresist layer in the memory array area;

applying the patterns in the first photoresist layer as a hard mask for etching the protective layer in the memory array area down to the surface of the doped polysilicon;

removing the first photoresist layer;

forming a second photoresist layer on the surface of the semiconductor wafer;

performing a second photolithographic process so as to define a plurality of gate patterns in the second photoresist layer in the periphery circuits region;

applying the patterns in the second photoresist layer and the protective layer remaining on the surface of the doped polysilicon layer as a hard mask to etch the undoped polysilicon layer in the periphery circuits region and the doped polysilicon layer in the memory array area down to the surface of the first dielectric layer, so as to simultaneously form a gate of each MOS in the periphery circuits region and in the memory array area;

performing a second ion implantation process so as to form lightly doped drains (LDD) of each MOS on the semiconductor wafer;

removing the second photoresist layer;

forming a silicon nitride layer and a second dielectric layer, respectively, on the surface of the semiconductor wafer and covering the surfaces of each gate;

performing an etching process for removing part of the second dielectric layer and the silicon nitride layer so as to form a spacer located on either side of the gate in the periphery circuits region; and performing a third ion implantation process so as to form the source and drain of each MOS in the periphery circuits region, and performing an ion implantation process to the undoped polysilicon layer in the gate of each MOS in the periphery circuits region at the same time.

2. The method of claim 1 wherein the first dielectric layer is composed of silicon dioxide (SiO$_2$) for use as the gate oxide layer of each MOS.

3. The method of claim 1 wherein the first protective layer is composed of a silicon nitride compound, and a first silicon-oxy-nitride (SiO$_x$N$_y$) layer is positioned between the protective layer and the undoped polysilicon layer for use as an anti-reflection coating.

4. The method of claim 1 wherein a second silicon-oxy-nitride (SiO$_x$N$_y$) layer can be formed on the surface of the semiconductor wafer as an anti-reflection coating prior to the formation of the second photoresist layer.

5. The method of claim 4 wherein the second silicon-oxy-nitride layer formed beneath the second photoresist layer is removed following the removal of the second photoresist layer.

6. The method of claim 1 wherein the method following the formation of the source and drain of each MOS in the periphery circuits region comprises:

forming a metal layer on the surface of the semiconductor wafer and covering the surfaces of each source, drain and gate in the periphery circuits region;

performing a first rapid thermal process;

performing a wet etching process for removing the unreacted metal layer on the surface of the semiconductor wafer; and performing a second rapid thermal process.

7. The method of claim 6 wherein the metal layer is composed of cobalt(Co), titanium(Ti), nickel(Ni) or molybdenum(Mo).

8. The method of claim 6 wherein the first rapid thermal process has a temperature range of 400° C.~600° C. and a heating duration of 10~50 seconds, and the second rapid thermal process has a temperature range of 600° C.~800° C. and a heating duration of 10~50 seconds.

9. A method for making an embedded memory metal oxide semiconductor (MOS), the method comprising:

providing a semiconductor wafer, with a memory array area and a periphery circuits region defined on the surface of the silicon substrate, the memory array area comprises at least one single cell-well, the periphery circuits region comprises at least one N-well and at least one P-well;

forming a first dielectric layer and an undoped polysilicon layer, respectively, on the surface of the semiconductor wafer;

performing a first ion implantation process in the undoped polysilicon layer in the memory array area so as to transform the undoped polysilicon layer in the memory array area into a doped polysilicon layer;

forming a protective layer and a first photoresist layer, respectively, on the surface of the semiconductor wafer;

performing a first photolithographic process so as to define a plurality of gate patterns in the first photoresist layer in the memory array area;

applying the patterns in the first photoresist layer as a hard mask for etching the protective layer in the memory array area down to the surface of the doped polysilicon;

removing the first photoresist layer;

forming a second photoresist layer on the surface of the semiconductor wafer;

performing a second photolithographic process so as to define a plurality of gate patterns in the second photoresist layer above the N-well and the P-well in the periphery circuits region;

applying the patterns in the second photoresist layer and the protective layer remaining on the surface of the doped polysilicon layer as a hard mask to etch the undoped polysilicon layer in the periphery circuits region and the doped polysilicon layer in the memory array area, respectively, down to the surface of the first dielectric layer, so as to simultaneously form a gate of each MOS in the periphery circuits region and the memory array area;

removing the second photoresist layer;

performing a second ion implantation process so as to form a lightly doped drain;

forming a silicon nitride layer and a second dielectric layer, respectively, on the surface of the semiconductor wafer and covering the surface of each gate;

performing an etching process for removing the second dielectric layer and the silicon nitride layer surrounding the gate above the P-well in the periphery circuits region to form a spacer, and performing a third ion implantation process so as to form the source and drain of an NMOS in the P-well; and performing an etching process for removing the second dielectric layer and the silicon nitride layer surrounding the gate above the N-well in the periphery circuits region to form a spacer, and performing a fourth ion implantation process so as to form the source and drain of a PMOS in the N-well.

10. The method of claim 9 wherein the first dielectric layer is composed of silicon dioxide ($SiO_2$) for use as the gate oxide layer of each MOS.

11. The method of claim 9 wherein the first protective layer is composed of a silicon nitride compound, and a first silicon-oxy-nitride ($SiO_xN_y$) layer is positioned between the protective layer and the undoped polysilicon layer for use as an anti-reflection coating.

12. The method of claim 9 wherein a second silicon-oxy-nitride($SiO_xN_y$) layer can be formed on the surface of the semiconductor wafer as an anti-reflection coating prior to the formation of the second photoresist layer.

13. The method of claim 12 wherein the second silicon-oxy-nitride layer formed beneath the second photoresist layer is removed following the removal of the second photoresist layer.

14. The method of claim 9 wherein the third and fourth ion implantation process separately dopes the undoped polysilicon layer in each of the gates above the P-well and N-well.

15. The method of claim 9 wherein the method following the formation of the source and drain of each MOS in the periphery circuits region comprises:

forming a metal layer on the surface of the semiconductor wafer and covering the surfaces of each source, drain and gate in the periphery circuits region;

performing a first rapid thermal process;

performing a wet etching process for removing the unreacted metal layer on the surface of the semiconductor wafer; and performing a second rapid thermal process.

16. The method of claim 15 wherein the metal layer is composed of cobalt(Co), titanium(Ti), nickel(Ni) or molybdenum(Mo).

17. The method of claim 15 wherein the first rapid thermal process has a temperature range of 400° C.~600° C. and a heating duration of 10~50 seconds, and the second rapid thermal process has a temperature range of 600° C.~800° C. and a heating duration of 10~50 seconds.

* * * * *